United States Patent
Lakdawala et al.

(10) Patent No.: US 7,565,393 B2
(45) Date of Patent: Jul. 21, 2009

(54) DISCRETE TIME FILTER HAVING GAIN FOR DIGITAL SAMPLING RECEIVERS

(75) Inventors: Hasnain Lakdawala, Hillsboro, OR (US); Krishnamurthy Soumyanath, Portland, OR (US); Stewart S. Taylor, Beaverton, OR (US); Stefan H. Andersson, Linkoping (SE)

(73) Assignee: Intel Corporation, Santa Clara, CA (US)

( * ) Notice: Subject to any disclaimer, the term of this patent is extended or adjusted under 35 U.S.C. 154(b) by 849 days.

(21) Appl. No.: 11/169,808

(22) Filed: Jun. 29, 2005

(65) Prior Publication Data

US 2007/0001754 A1    Jan. 4, 2007

(51) Int. Cl.
*G06G 7/02* (2006.01)
(52) U.S. Cl. ..................................... 708/819
(58) Field of Classification Search .................. 708/819
See application file for complete search history.

(56) References Cited

U.S. PATENT DOCUMENTS

| | | | |
|---|---|---|---|
| 5,289,059 A | 2/1994 | Pikkarainen | |
| 5,724,653 A | 3/1998 | Baker et al. | |
| 6,829,311 B1 * | 12/2004 | Riley | 375/326 |
| 7,003,276 B2 | 2/2006 | Muhammad et al. | |
| 7,212,141 B2 | 5/2007 | Lakdawala et al. | |
| 2002/0110189 A1 | 8/2002 | Souissi et al. | |
| 2004/0063418 A1 | 4/2004 | Kluge et al. | |
| 2005/0025270 A1 | 2/2005 | Muhammad et al. | |
| 2005/0104654 A1 | 5/2005 | Muhammad et al. | |
| 2007/0008208 A1 | 1/2007 | Lakdawala et al. | |

OTHER PUBLICATIONS

Chen, Feng, et al., "A 0.25mW 13b Passive Modulator for a 10MHz IF Input", *IEEE International Solid-State Circuits Conference*, (1996),3 pages.
Ranganathan, Sanjeev, et al., "Discrete-Time Parametic Amplification Based on a Three-Terminal MOS Varactor: Analysis and Experimental Results", *IEEE Journal of Solid-State Circuits*, vol. 38, (Dec. 2003),2087-2093.

* cited by examiner

*Primary Examiner*—Tan V Mai
(74) *Attorney, Agent, or Firm*—The Law Offices of John C. Scott, LLC; John C. Scott

(57) ABSTRACT

A discrete time filter achieves gain by sampling a signal using capacitors arranged in a one configuration and then changing the capacitors to a series configuration to develop a filter output voltage. In at least one embodiment, a variable gain filter is achieved by varying the number of capacitors that are active in the filter.

30 Claims, 4 Drawing Sheets

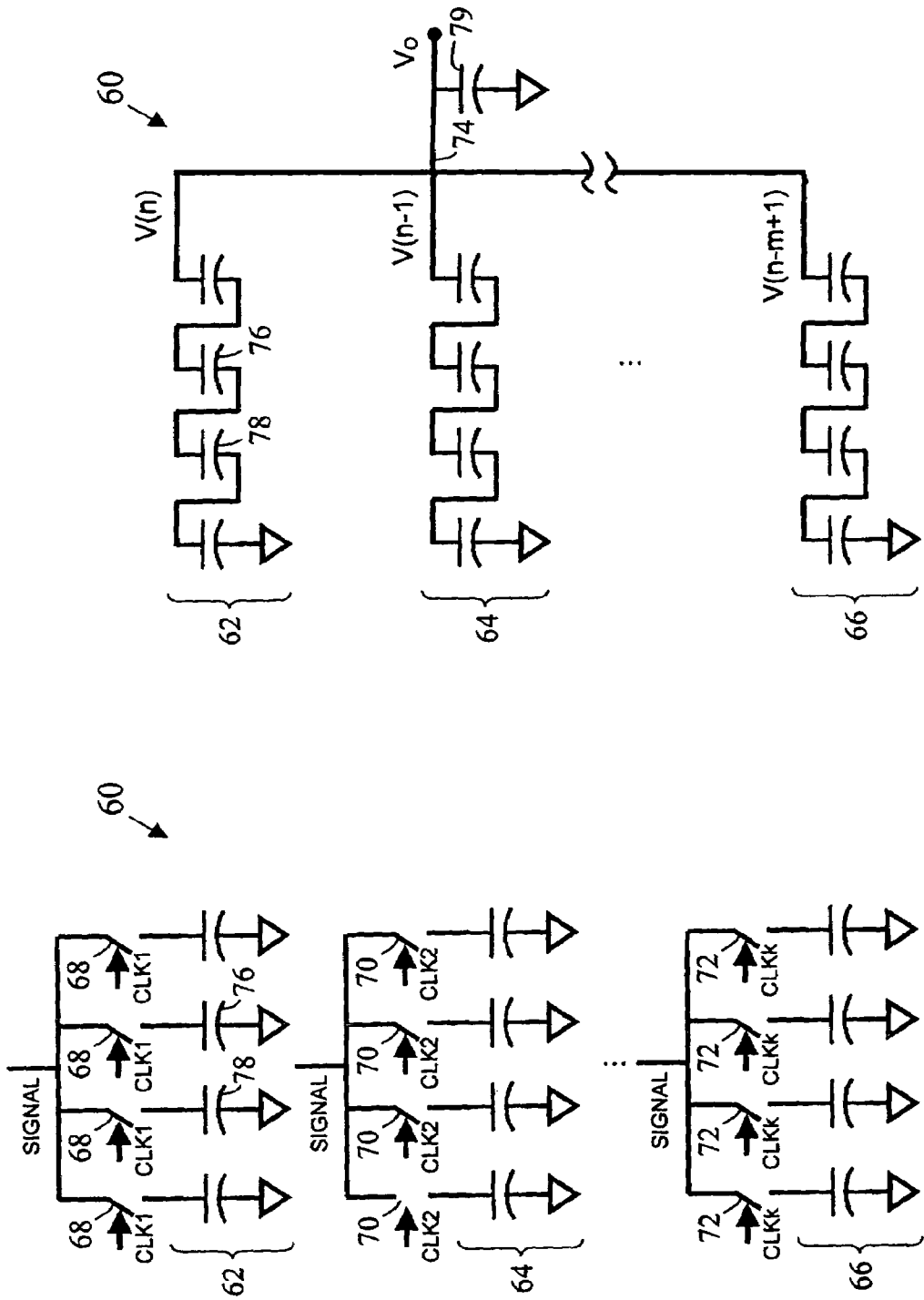

US 7,565,393 B2

DISCRETE TIME FILTER HAVING GAIN FOR DIGITAL SAMPLING RECEIVERS

TECHNICAL FIELD

The invention relates generally to discrete time filters and, more particularly, to techniques and structures for achieving gain in a discrete time filter.

BACKGROUND OF THE INVENTION

Digital sampling receivers are radio frequency (RF) receivers that sample a received signal at RF frequencies. After sampling, the signal may be filtered in a discrete time filter and decimated in one or several steps. The filtered signal may then be applied to an analog-to-digital converter which converts the signal to a digital representation. There is a need for novel techniques for implementing discrete time filters within digital sampling receivers.

BRIEF DESCRIPTION OF THE DRAWINGS

FIGS. 5 and 6 are schematic diagrams illustrating an example of a filter arrangement in accordance with another embodiment of the present invention;

DETAILED DESCRIPTION

Figure 1:
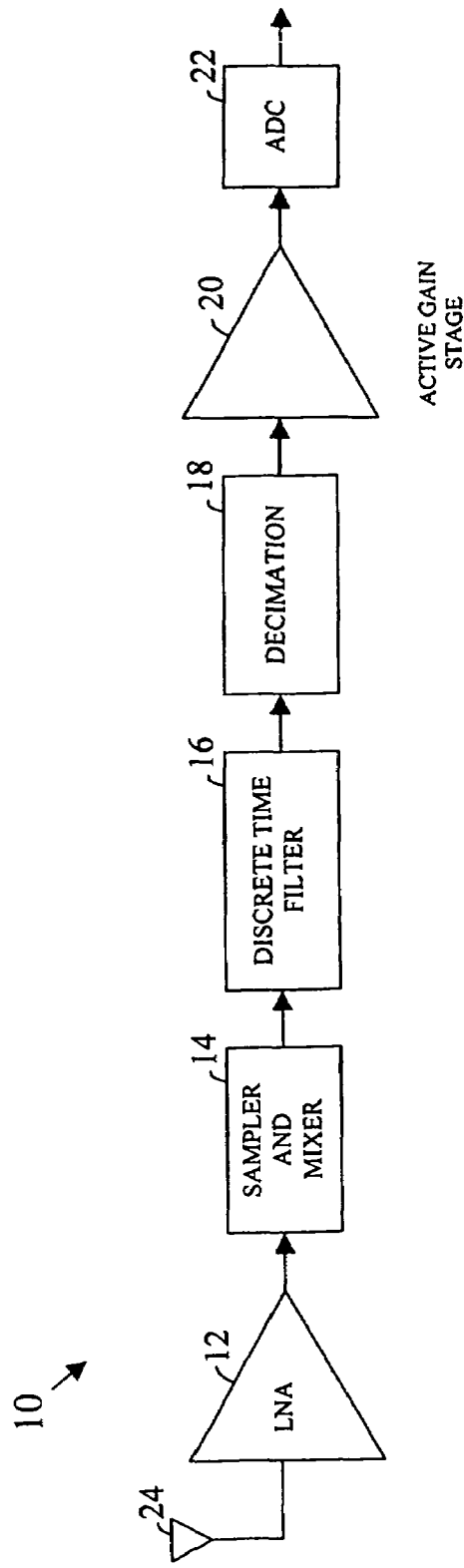
FIG. 1 is a block diagram illustrating an example of a digital sampling receiver architecture.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating an example of a digital sampling receiver architecture 10. As shown, the architecture 10 may include: a low noise amplifier (LNA) 12, a sampler/mixer 14, a discrete time filter 16, a decimation unit 18, an active gain stage 20, and an analog-to-digital converter (ADC) 22. One or more antennas 24 may be provided to facilitate the reception of RF signals from a wireless channel. Any type of antenna(s) may be used including, for example, a dipole, a patch, a helical antenna, a horn, a slot antenna, an antenna array, and/or others. The LNA 12 amplifies the signal received by the antenna 24 in a low noise manner. The sampler/mixer 14 samples the received signal at an RF frequency and down converts the signal. The discrete time filter 16 then filters the signal. This filtering may be performed to, for example, avoid noise aliasing during subsequent decimation (in decimation unit 18), filter out in-band interferers, and/or for other reasons. The decimation unit 18 reduces the sampling rate of the received signal by a predetermined decimation rate. For example, if the original sampling rate was $F_S$ then the sampling rate at the output of the decimation unit 18 might be $F_S/M$, where $1/M$ is the decimation rate.

The decimated signal is applied to the active gain stage 20 for amplification. The active gain stage 20 may be implemented using, for example, an operational amplifier or other similar analog, powered component. The amplified signal output by the active gain stage 20 is delivered to the ADC 22 to be converted to a digital representation. The active gain stage 20 may be included within the receiver architecture 10 so that the signal applied to the ADC 22 takes advantage of the full dynamic range of the ADC 22. However, the use of an active gain stage may add to the complexity of the receiver design, may increase implementation costs, and may increase the overall power consumption of the receiver. For this reason, it would be advantageous if a digital sampling receiver could be designed that does not require the use of an active gain stage.

Figure 2:
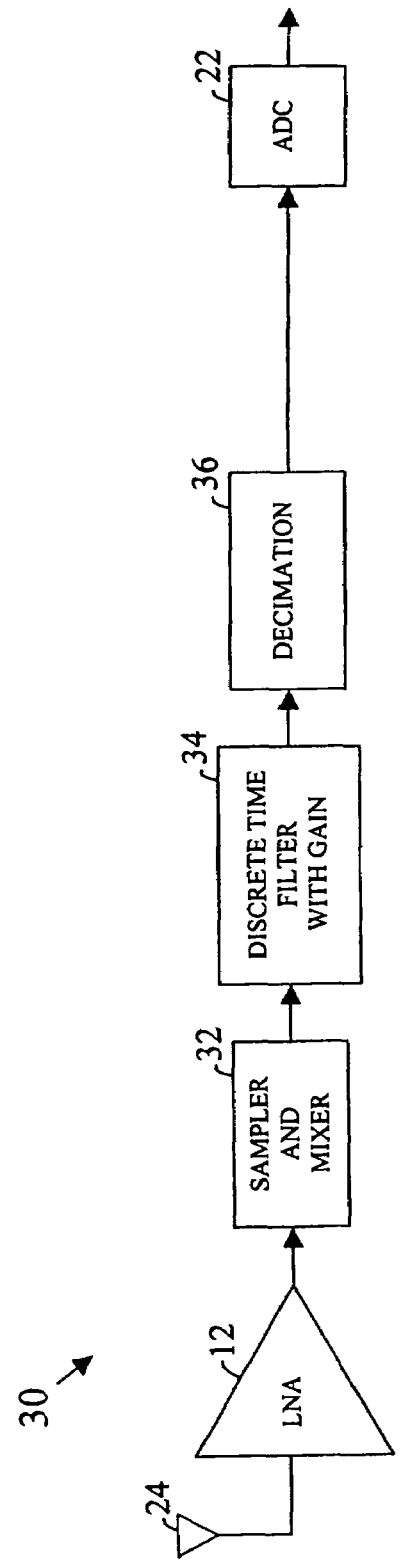
FIG. 2 is a block diagram illustrating an example of a digital sampling receiver architecture that uses a discrete time filter having gain in accordance with an embodiment of the present invention.

In one aspect of the present invention, a discrete time filter is provided that is capable of achieving gain. Because the filter has gain, a digital sampling receiver that incorporates the filter may be able to dispense with the need for a separate active gain stage within the receiver chain or reduce their number. FIG. 2 is a block diagram illustrating an example of a digital sampling receiver architecture 30 that uses a discrete time filter having gain in accordance with an embodiment of the present invention. As shown, the digital sampling receiver architecture 30 may include: an LNA 12, a sampler/mixer 32, a discrete time filter with gain 34, a decimation unit 36, and an ADC 22. The LNA 12, the sampler/mixer 32, the decimation unit 36, and the ADC 22 may operate as described above. The discrete time filter with gain 32, however, provides amplification to the received signal in addition to the filtering function. For this reason, there is no or reduced need for an active gain stage before the ADC 22. Techniques for achieving this gain are described in greater detail below. In at least one embodiment of the invention, sampling, filtering, and decimation may be performed within a single filter structure.

Figure 3:
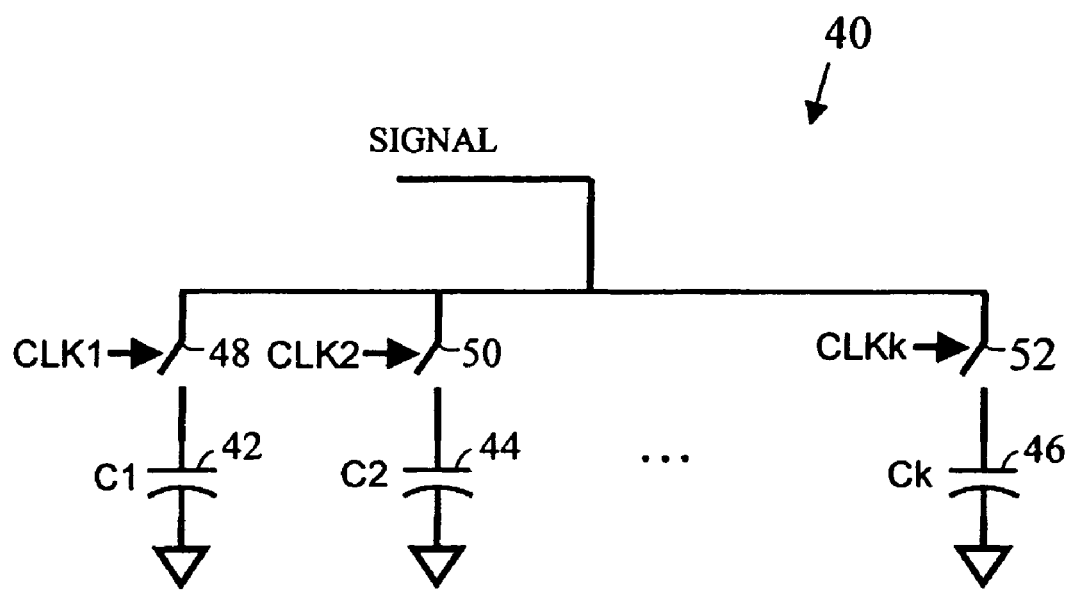
FIGS. 3 and 4 are schematic diagrams illustrating an example of a filter arrangement in accordance with an embodiment of the present invention.
Figure 4:
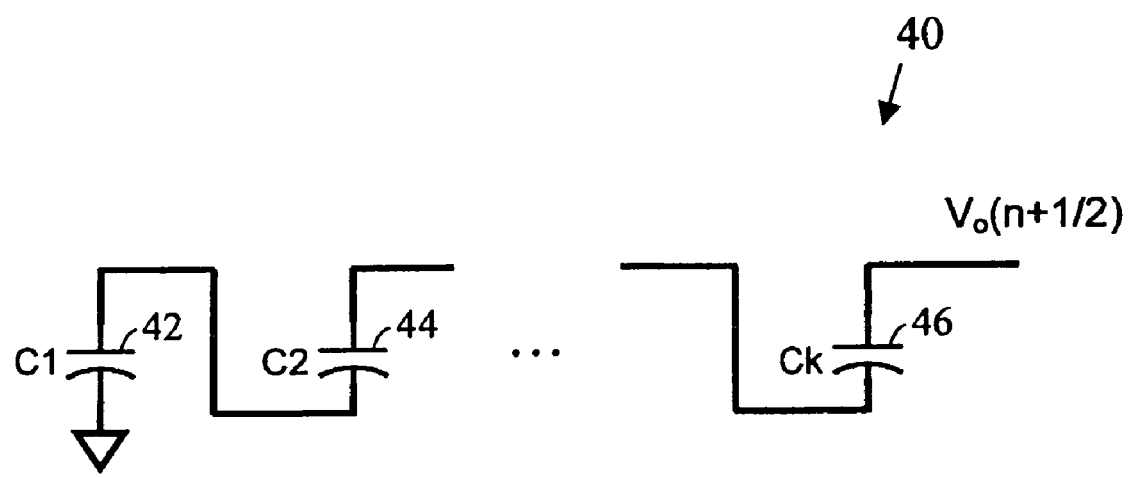

FIGS. 3 and 4 are schematic diagrams illustrating an example of a filter arrangement 40 in accordance with an embodiment of the present invention. The filter arrangement 40 may be used as, for example, the sampler/mixer 32 and the discrete time filter with gain 34 (and possibly the decimation unit 36) of the digital sampling receiver 30 of FIG. 2. The filter arrangement 40 may also be used in other applications. As will be described in greater detail, the filter arrangement 40 uses a number of capacitors to sample an input signal at a relatively high sampling rate (e.g., RF frequencies), one at a time in successive clock periods. After sampling, the capacitors are connected in a series configuration and the total series voltage level is recorded. This technique of adding the sampled voltages in series may be used to form a finite impulse response (FIR) filter (or an infinite impulse response (IIR) filter). In addition, because the voltages on the capacitors are added together in series, an overall gain may be achieved within the filter. If an IIR filter is desired, the charge on the series connected capacitors can be integrated on an output capacitor.

With reference to FIG. 3, a number of capacitors 42, 44, 46 (C1, C2, ..., Ck) are first connected in a non-series configuration for use during sampling. Each of the capacitors 42, 44, 46 has a corresponding sampling switch 48, 50, 52 that is used to sample an input signal. The input signal of the filter may be, for example, the output signal of an LNA in a digital sampling receiver (see FIG. 2). Other types of input signal may alternatively be used. The sampling switches 48, 50, 52 are clocked one after another to each sample the input signal at a different instant in time (i.e., a different sample time). A predetermined sampling rate may be used. When a sampling switch 48, 50, 52 is clocked, the corresponding capacitor 42, 44, 46 will assume the voltage of the input signal at that instant in time. Any number of capacitors may be used in the filter arrangement 40. Each capacitor acts as a separate tap within the filter structure.

Referring now to FIG. 4, after all of the capacitors 42, 44, 46 have sampled the input signal, the capacitors may be connected in a series configuration to help develop an output signal of the filter. This may be accomplished, for example, by using a number of configuration switches (not shown in FIG. 4) within the filter arrangement 40 to change the way the capacitors 42, 44, 46 are interconnected. Once in the series configuration, the sampled voltages on the capacitors 42, 44, 46 add in series, resulting in an output voltage $V_0$ at the $n+\frac{1}{2}$ cycle. This output voltage may be expressed as follows:

$$V_0\left(n + \frac{1}{2}\right) = \left(\frac{1}{C_1} + \frac{1}{C_2} + \ldots + \frac{1}{C_k}\right)(C_1 V(n-k) + C_2 V(n-k+1) + \ldots + C_k V(n))$$

where V(n) is the sampled voltage at sample time n. By defining $$\frac{1}{C_f}$$

as:

$$\frac{1}{C_f} = \left(\frac{1}{C_1} + \frac{1}{C_2} + \ldots + \frac{1}{C_k}\right)$$

and taking the Z transform of the above equation, the following expression results:

$$V_0(z)z^{1/2} = \frac{1}{C_f}(C_1 z^{-k} + C_2 z^{-k+1} + \ldots + C_k)V(z)$$

The transfer function of the filter may therefore be represented as:

$$T(z) = \frac{(C_1 z^{-k} + C_2 z^{-k+1} + \ldots + C_k)z^{-1/2}}{C_f}$$

For illustration purposes, if $C_1 = C_2 = C_k$, then the above equation can be rewritten as:

$$T(z) = k(z^{-k} + z^{-k+1} + \ldots + 1)z^{-1/2}$$

This is the transfer function of a FIR filter having a gain k that is greater than 1. The gain is achieved because the voltages across the various capacitors are added in series. In general, to achieve a desired filter shape, the capacitor values $C_1, C_2, \ldots, C_k$ have to be appropriately selected. Techniques for determining filter weights to achieve a desired filter response are well known in the art. Because the filter outputs one sample for every k clocks, the decimation rate achieved by the filter is 1/k. This decimation feature may be used to achieve frequency translation in a digital sampling receiver. In at least one embodiment of the invention, the decimation rate of a filter is adjustable by digital selection of the number of capacitors that are connected in series. That is, the number of capacitors that are connected in series can be modified during operation of the receiver. This change in the number of capacitors that are connected in series may also be used to adjust the gain of the filter. These features may be used to support, for example, multi-standard operation within a receiver.

FIGS. 5 and 6 are schematic diagrams illustrating an example of a filter arrangement 60 in accordance with an embodiment of the present invention. The filter arrangement 60 may be used within the digital sampling receiver architecture 30 of FIG. 2 and in other applications. As shown in FIG. 5, the filter arrangement 60 includes a number of capacitor groups 62, 64, 66 that each include a number of capacitors that are initially arranged in a non-series configuration. Each capacitor group 62, 64, 66 includes corresponding sampling switches 68, 70, 72 that are used to sample an input signal at a corresponding instant in time (i.e., a sample time). When clocked, each sampling switch 68, 70, 72 allows the present voltage of the input signal to be stored within a corresponding capacitor within the associated capacitor group 62, 64, 66. In the illustrated embodiment, each capacitor group 62, 64, 66 includes 4 capacitors. However, any number of capacitors may be used in each group 62, 64, 66. In addition, any number of different groups may be used. The capacitor groups 62, 64, 66 are clocked one group at a time (i.e., CLK1, CLK 2, ..., CLKk) at a desired sampling rate (e.g., an RF rate). In the illustrated embodiment, each capacitor within a group has a corresponding sampling switch and all of the sampling switches within the group are sampled at the same time. In at least one embodiment, these multiple sampling switches are replaced by a single switch for connecting a signal line to all of the capacitors in the corresponding group.

After all of the capacitor groups 62, 64, 66 have been clocked, each group is rearranged into a series configuration, as shown in FIG. 6. A plurality of configuration switches (not shown in FIGS. 5 and 6) may be provided for changing the configuration of the capacitors. Once the configuration of each capacitor group 62, 64, 66 has changed, a corresponding voltage will form at an end of each serially connected group. For example, a voltage V(n) may form at an end of first group 62 (the capacitors of which sampled the input signal at sample time n), a voltage V(n−1) may form at an end of second group 64 (the capacitors of which sampled the input signal at sample time n−1), and so on. The ends of the serially connected capacitor groups are connected together at an output node 74. An output voltage Vo forms on the output node 74 that is a weighted average of the voltages generated by each capacitor group 62, 64, 66. An optional output capacitor 79 may be provided to integrate the individual output voltages when implementing an IIR filter. When implementing an FIR filter, the output capacitor 79 can be left out.

In at least one embodiment, the output voltage Vo (at the n+½ cycle) may be expressed as follows:

$$V_0(n+1/2) = \frac{\sum_{r=0}^{k-1} C_r v(n-r)}{\sum_{r=0}^{k-1} \frac{C_r}{p}}$$

where $C_r$ is the unit capacitor in the rth capacitor group, which is a part of the k capacitor groups 62, 64, 66. Each of the k capacitor groups 62, 64, 66 consists of p capacitors of value $C_r$. The same value need not be used, and has been demonstrated here for simplicity. The transfer function of the filter may be expressed as:

$$T(z) = z^{-1/2} p \frac{\sum_{r=0}^{k-1} C_r z^{-r}}{\sum_{r=0}^{k-1} C_r}.$$

The above equation illustrates that a gain of p has been achieved by the filter arrangement 60. This gain was realized by using multiple capacitors in each group 62, 64, 66 and adding the sampled voltages within each group together in series before combining the group voltages. Each capacitor group 62, 64, 66 acts as a filter tap of the corresponding FIR filter. The shape of the transfer function of the filter may be designed by appropriately selecting capacitor values for the capacitors in each capacitor group. Because the filter arrangement 60 generates one output sample for every m clocks, the decimation rate achieved by the filter is 1/m. This decimation feature may be used to achieve frequency translation in a corresponding digital sampling receiver. Using a different p (number of capacitor within each group) allows an extra degree of freedom in the design of the FIR filter coefficients. Changing the number p for each capacitor group 62, 64, 66 during operation allows reconfiguration of the filter dynamically for different wireless standards.

In at least one embodiment of the present invention, a variable gain discrete time filter is provided. In the filter arrangement 60 of FIGS. 5 and 6, it was shown that the gain of the filter is directly related to the number of capacitors (p) within each capacitor group. A variable gain may therefore be achieved by providing means for varying the number of capacitors that are active within each of the groups (i.e., the number of capacitors that will be connected in series). In one approach, this technique is realized by including a maximum number of capacitors within each group (i.e., a number that is capable of achieving a maximum desired gain) and then using switches to either connect or disconnect certain capacitors in each group. For example, in one implementation, each capacitor group may have 8 capacitors that are available for use. However, when less gain is needed, it may be decided to utilize only four of the available capacitors within each group. In at least one embodiment, a control unit may be provided to determine how much filter gain is needed at a particular time and to activate a number of capacitors that is capable of achieving the desired gain. Different gains may be necessary to support, for example, different wireless standards within a wireless device. In the filter arrangement 40 of FIGS. 3 and 4, an adjustable gain may also be achieved by providing means for varying the number of capacitors that are connected together serially.

In at least one aspect of the present invention, filter structures are provided that are capable of achieving a variable filter response. That is, the filter weights of the filter may be changed dynamically to modify the location of the filter zeros. With reference to FIG. 5, in one implementation, this may be achieved by varying the number of capacitors that are active within each of the capacitor groups 62, 64, 66. By capacitors that are "active," it is meant the capacitors that are sampling and that are subsequently connected in series. By varying the number of active capacitors in each group, different overall capacitances may be achieved which will result in different filter weights. As described previously, techniques for determining the filter weights that are needed to achieve a desired filter shape are well known in the art. In other embodiments, variable capacitors may be used to achieve different filter weights. Different filter responses (shapes) may be necessary to support, for example, different wireless standards within a wireless device.

The embodiments shown in FIGS. 3-6 illustrate two possible filter architectures that may be implemented in accordance with the present invention. It should be appreciated that other filter architectures that sample a signal using a number of capacitors and then connect the capacitors in a series configuration after sampling to add the resulting sampled voltages may also be used. For example, in at least one embodiment, a combination of the two approaches illustrated in FIGS. 3-6 is used to achieve gain within a discrete time filter. One potential problem that may arise in a discrete time filter design in accordance with the invention is that charge sharing loss may occur when the capacitors are series connected to a grounded parasitic capacitor. Such charge sharing losses may reduce the overall gain achieved in the filter. As will be apparent to a person of ordinary skill in the art, these charge sharing losses can be managed by proper layout and design.

Figure 7:
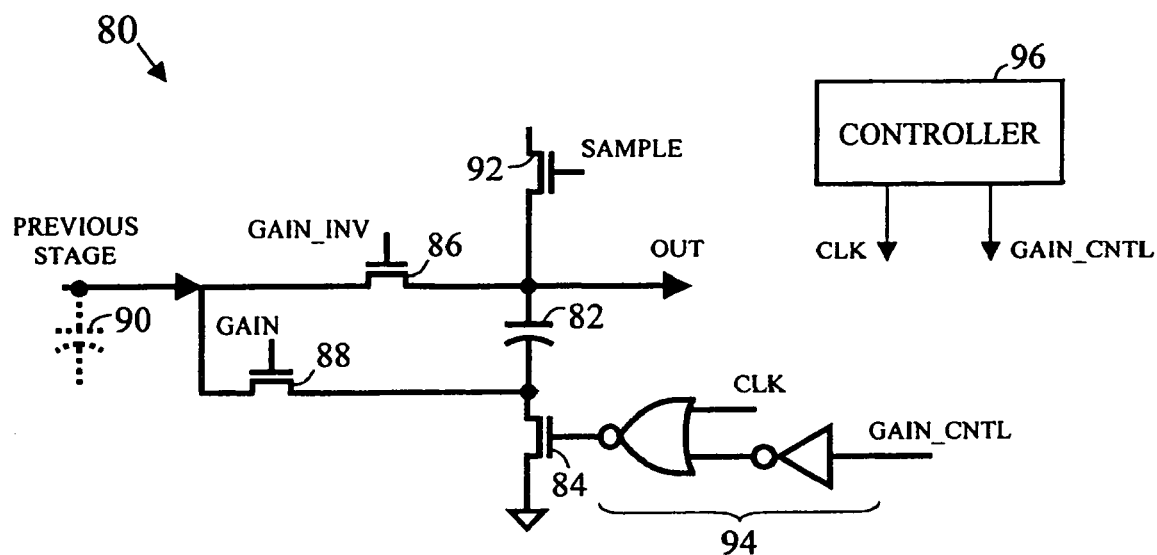
FIG. 7 is a schematic diagram illustrating an example of a circuit that may be used to realize a discrete time filter in accordance with an embodiment of the present invention.

FIG. 7 is a schematic diagram illustrating an example of a circuit 80 that may be used to realize a discrete time filter in accordance with an embodiment of the present invention. The circuit 80 may be provided, for example, for each of the capacitors in each capacitor group 62, 64, 66 in the filter arrangement 60 of FIGS. 5 and 6. A slightly modified version of the circuit 80 may be used with the capacitors in the filter arrangement 40 of FIGS. 3 and 4. The circuit 80 (with or without modifications) may also be used in discrete time filters having other architectures. With reference to FIG. 7, the capacitor 82 represents a capacitor within a filter arrangement (e.g., capacitor 76 within capacitor group 62 in FIGS. 5 and 6). A sampling switch 92 is operative for sampling an input signal at an appropriate sampling time (see, for example, sampling switch 68 of FIG. 5). A ground switch 84 may be provided to controllably couple the capacitor 82 to ground. When sampling is being performed, for example, the ground switch 84 may be used to connect the capacitor 82 to ground (see, for example, capacitor 76 in FIG. 5). When the filter arrangement is changed to a series configuration, the capacitor 82 may be disconnected from ground using the switch 84 (see, for example, capacitor 76 in FIG. 6). Logic circuitry 94 may be provided to control the operation of the ground switch 84.

Figure 8:
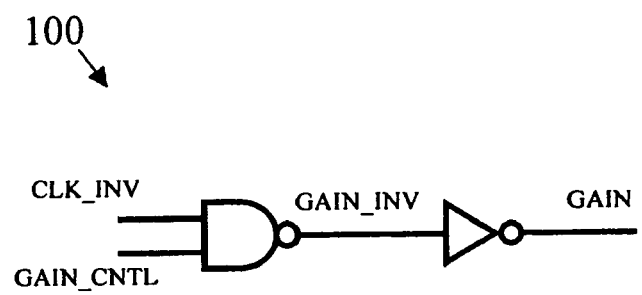
FIG. 8 is a schematic diagram illustrating an example of logic circuitry that may be used to control the operation of the circuitry of FIG. 7.

Configuration switches 86, 88 may be provided for changing the configuration of the capacitors from a non-series configuration during sampling to a series configuration during output signal formation. For example, capacitor 90 in FIG. 7 (shown dotted) may represent an adjacent capacitor to capacitor 82 within a filter arrangement (e.g., capacitor 78 which is adjacent to capacitor 76 within capacitor group 62 of FIGS. 5 and 6). When a sampling configuration is to be maintained (as in FIG. 5), configuration switch 86 may be turned "on" and configuration switch 88 may be turned "off." Conversely, when a serial configuration is to be maintained (as in FIG. 6), configuration switch 88 may be turned "on" and configuration switch 86 may be turned "off." FIG. 8 is a schematic diagram illustrating logic circuitry 100 that may be used to control the operation of the configuration switches 86, 88. As shown, in the illustrated embodiment, the control signal (GAIN_INV) that controls configuration switch 86 is the inverse of the control signal (GAIN) that controls configuration switch 88. The switches 84, 86, 88, 92 within the circuitry 80 may include any type of electrically controllable switch including, for example, field effect transistors (FETs), bipolar junction transistors, transmission gates, and/or others.

In at least one embodiment of the invention, the circuitry 80 of FIG. 7 may also be used to modify the number of capacitors that are connected within a discrete time filter at a particular time. As discussed previously, this feature can be used to adjust the gain of the filter and/or the response of the filter. For example, with reference to FIG. 6, if a lower gain is desired within the filter arrangement 60, then the number of connected capacitors within each capacitor group 62, 64, 66 may be reduced from four to, say, two. For group 62, this can be accomplished by maintaining the connection between capacitor 76 and ground after changing to the series configuration of FIG. 6. The voltage V(n) will therefore be the series combination of two capacitor voltages. This can be done for each capacitor group 62, 64, 66 in the filter arrangement 60. In at least one embodiment, a different number of capacitors may be connected within each capacitor group 62, 64, 66 to achieve some additional control over the shape of the filter transfer function. This will change the filter weights of the FIR filter and may therefore be used to adjust the location of the zeros within the filter transfer function. This feature can be used, for example, to move one or more of the zeros to the known location of an interference signal in the surrounding environment. The feature may be useful within, for example, a cognitive radio that can provide information about interferers in the vicinity. As shown in FIG. 7, one or more controllers 96 may be provided in some embodiments to control the sampling of the input signal, the switching and reconfiguration of the filter, the variation of filter gain, the adjustment of the filter response, and/or the variation of the filter decimation rate. A dedicated controller (or controllers) may be provided or the local digital baseband processor may be used.

As described above, in some embodiments, the inventive discrete time filter having gain is implemented within a digital sampling receiver. These filters may also be used in a variety of other devices, components, and systems. In at least one embodiment, the inventive discrete time filter is implemented within a radio unit that is capable of operating using multiple different wireless standards (e.g., a software defined radio, etc.). Embodiments of the invention have application in wireless networks, wireless cellular systems, terrestrial wireless links, wireless distribution systems, satellite systems, and/or other wireless systems. Embodiments may also be implemented within wired systems. Features of the invention may be embodied within cellular telephones and other handheld wireless communicators; personal digital assistants having wireless capability; laptop, palmtop, desktop, and tablet computers having wireless capability; pagers; satellite communicators; audio/video devices, cameras, and other appliances having wireless capability; wireless network interface cards (NICs) and other network interface structures; integrated circuits; as instructions and/or data structures stored on machine readable media; and/or in other formats. Examples of different types of machine readable media that may be used include floppy diskettes, hard disks, optical disks, compact disc read only memories (CD-ROMs), magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data. Hardware, software, firmware, and hybrid implementations may be used.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A discrete time filter comprising:
a group of capacitors to sample an input signal and temporarily store corresponding sampled voltages, said group of capacitors being arranged in a non-series configuration during sampling; and
a plurality of switches to switch said capacitors from said non-series configuration to a series configuration after sampling, said series configuration of capacitors to cause said sampled voltages on said capacitors to add in series.

2. The discrete time filter of claim 1, wherein:
each capacitor in said group of capacitors has a corresponding sampling switch for use in sampling said input signal, wherein each capacitor in said group is to sample said input signal at a different sample time.

3. The discrete time filter of claim 1, wherein:
said group of capacitors has at least one sampling switch for use in sampling said input signal, wherein each capacitor in said group is to sample said input signal at the same sample time.

4. The discrete time filter of claim 3, wherein:
said group of capacitors is a first group of capacitors and said plurality of switches is a first plurality of switches; and
said discrete time filter further comprises:
a second group of capacitors to sample said input signal and temporarily store corresponding sampled voltages, said second group of capacitors being arranged in a non-series configuration during sampling; and
a second plurality of switches to switch said capacitors in said second group from said non-series configuration to a series configuration after sampling, said series configuration of capacitors in said second group to cause said sampled voltages on said capacitors in said second group to add in series.

5. The discrete time filter of claim 4, wherein:
said series configuration of capacitors of said first group and said series configuration of capacitors of said second group are each connected to a common output node.

6. The discrete time filter of claim 5, further comprising:
a ballast capacitor connected between said common output node and ground to achieve an IIR filter response.

7. The discrete time filter of claim 4, further comprising:
at least one additional group of capacitors, in addition to said first and second group, to sample said input signal and temporarily store corresponding sampled voltages, said at least one additional group of capacitors being arranged in a non-series configuration during sampling; and
at least one additional plurality of switches, in addition to said first and second plurality of switches, to switch said capacitors in said at least one additional group from said non-series configuration to a series configuration after sampling, said series configuration of capacitors in said at least one additional group to cause said sampled voltages on said capacitors in said at least one additional group to add in series.

8. The discrete time filter of claim 4, wherein:
said first group of capacitors and said second group of capacitors each represent a filter tap of said discrete time filter, wherein capacitance values of capacitors in said first and second groups of capacitors are selected to achieve a desired tap weight for the filter.

9. The discrete time filter of claim 1, further comprising:
a controller to control a number of capacitors that are connected in series in said group of capacitors to control a gain of said discrete time filter.

10. The discrete time filter of claim 1, further comprising:
a controller to control a number of capacitors that are connected in series in said group of capacitors to control a decimation rate of said filter.

11. The discrete time filter of claim 1, further comprising:
a controller to control a number of capacitors that are connected in series in said group of capacitors to modify a transfer function of said filter.

12. The discrete time filter of claim 1, further comprising:
a controller to control said plurality of switches to switch said capacitors from said non-series configuration to said series configuration after sampling.

13. A computer implemented method for use in filtering a signal, comprising:
sampling an input signal using a group of capacitors connected in a non-series configuration; and
converting said non-series configuration of capacitors to a series configuration, after sampling, so that sampled voltages on said capacitors add in series.

14. The method of claim 13, wherein:
sampling an input signal includes temporarily connecting one capacitor after another in said group of capacitors to a node carrying said input signal, at a predetermined sampling rate.

15. The method of claim 13, wherein:
sampling an input signal includes temporarily connecting multiple capacitors in said group to a node carrying said input signal at a first sampling time.

16. The method of claim 15, wherein:
said group of capacitors is a first group of capacitors; and
said method further comprises:
sampling said input signal on a second group of capacitors connected in a non-series configuration, wherein sampling said input signal on said second group of capacitors includes temporarily connecting multiple capacitors in said second group to said node carrying said input signal at a second sampling time, said second sampling time being different from said first sampling time; and
converting said non-series configuration of capacitors in said second group to a series configuration, after sampling, so that sampled voltages on said capacitors in said second group add in series.

17. The method of claim 16, further comprising:
connecting said series configuration of capacitors in said first group and said series configuration of capacitors in said second group to a common output node.

18. The method of claim 16, further comprising:
sampling said input signal using at least one additional group of capacitors connected in a non-series configuration, wherein sampling said input signal using said at least one additional group of capacitors includes temporarily connecting multiple capacitors in said at least one additional group to said node carrying said input signal at a corresponding sampling time; and
converting said non-series configuration of capacitors in said at least one additional group to a series configuration, after sampling, so that sampled voltages on said capacitors in said at least one additional group add in series.

19. The method of claim 13, further comprising:
determining a gain to be achieved while filtering said input signal; and
electronically adjusting the number of capacitors that are active in said group of capacitors based on said desired gain.

20. The method of claim 19, wherein:
electronically adjusting includes delivering control signals to switches associated with said group of capacitors.

21. The method of claim 13, further comprising:
determining a decimation rate to be achieved while filtering said input signal; and
electronically adjusting the number of capacitors that are active in said group of capacitors based on said desired decimation rate.

22. The method of claim 13, further comprising:
determining a decimation rate to be achieved while filtering said input signal; and
electronically adjusting a number of capacitor groups that are active based on said desired decimation rate.

23. The method of claim 13, further comprising:
determining a filter response to be achieved while filtering said input signal; and
electronically adjusting a number of capacitors within each of a number of capacitor groups that are active based on said desired filter response.

24. A digital sampling receiver comprising:
a dipole antenna to receive a signal from a wireless channel; and
a discrete time filter to filter said received signal, said discrete time filter comprising:
a group of capacitors to sample said received signal and temporarily store corresponding sampled voltages, said group of capacitors being arranged in a non-series configuration during sampling; and
a plurality of switches to switch said capacitors from said non-series configuration to a series configuration after sampling, said series configuration of capacitors to cause said sampled voltages on said capacitors to add in series.

25. The digital sampling receiver of claim 24, wherein:
each capacitor in said group of capacitors has an associated sampling switch for use in sampling said received signal, wherein each capacitor in said group is to sample said received signal at a different sample time.

26. The digital sampling receiver of claim 24, wherein:
said group of capacitors has at least one sampling switch to sample said received signal, wherein said capacitors in said group sample said received signal at the same sample time.

27. The digital sampling receiver of claim 24, further comprising:
a low noise amplifier between said dipole antenna and said discrete time filter to amplify said received signal before it is filtered.

28. An article comprising a computer readable storage medium having instructions stored thereon that, when executed by a computing platform, operate to:
sample an input signal using a group of capacitors connected in a non-series configuration; and
convert said non-series configuration of capacitors to a series configuration, after sampling, so that sampled voltages on said capacitors add in series.

29. The article of claim 28, wherein:
operation to sample said input signal includes operation to temporarily connect one capacitor after another to a node carrying said input signal at a predetermined sampling rate.

30. The article of claim 28, wherein:
operation to sample said input signal includes operation to temporarily connect the capacitors in said group to a node carrying said input signal at a first sampling time.

* * * * *